US007165603B2

(12) United States Patent
Mochizuki et al.

(10) Patent No.: US 7,165,603 B2
(45) Date of Patent: Jan. 23, 2007

(54) TOWER TYPE HEAT SINK (75) Inventors: Masataka Mochizuki, Nagareyama (JP); Koichi Mashiko, Utsunomiya (JP)

(73) Assignee: Fujikura Ltd., Tokyo (JP)

(*) Notice: Subject to any disclaimer, the term of this patent is extended or adjusted under 35 U.S.C. 154(b) by 0 days.

(21) Appl. No.: 10/411,281

(22) Filed: Apr. 11, 2003

(65) Prior Publication Data
US 2003/0218849 A1 Nov. 27, 2003

(30) Foreign Application Priority Data
Apr. 15, 2002 (JP) ............................. 2002-112748
Aug. 1, 2002 (JP) ............................. 2002-224959

(51) Int. Cl.
F28D 15/00 (2006.01)
F28F 7/00 (2006.01)
H05K 7/20 (2006.01)

(52) U.S. Cl. ...................... 165/104.21; 165/104.33; 165/80.3

(58) Field of Classification Search ........... 165/104.21, 165/104.26, 104.33, 185, 80.4, 80.3; 361/700, 361/702–704; 257/714–716; 174/15.2
See application file for complete search history.

(56) References Cited

U.S. PATENT DOCUMENTS

| | | | |
|---|---|---|---|
| 5,412,535 A | | 5/1995 | Chao et al. |
| 5,901,040 A * | | 5/1999 | Cromwell et al. ............ 361/704 |
| 6,102,110 A * | | 8/2000 | Julien et al. ............ 165/104.33 |
| 6,394,175 B1 * | | 5/2002 | Chen et al. ................ 165/80.3 |
| 6,779,595 B1 * | | 8/2004 | Chiang .................. 165/104.33 |
| 6,830,098 B1 * | | 12/2004 | Todd et al. ............ 165/104.33 |
| 6,894,900 B2 * | | 5/2005 | Malone ...................... 361/700 |
| 6,915,844 B2 * | | 7/2005 | Chou ..................... 165/104.33 |
| 6,918,429 B2 * | | 7/2005 | Lin et al. .................. 165/80.3 |
| 6,945,319 B1 * | | 9/2005 | Li et al. ................ 165/104.33 |
| 2003/0019610 A1 * | | 1/2003 | Liu ............................. 165/80.3 |
| 2003/0141041 A1 * | | 7/2003 | Chen ........................... 165/80.3 |
| 2004/0035558 A1 * | | 2/2004 | Todd et al. ............ 165/104.26 |
| 2004/0134642 A1 * | | 7/2004 | Lo ........................ 165/104.21 |

FOREIGN PATENT DOCUMENTS

| | | | | |
|---|---|---|---|---|
| JP | 57-42154 | * | 3/1982 | ............ 165/104.33 |
| JP | 9-331177 | * | 5/1997 | ............ 165/104.33 |
| JP | 11-351769 | * | 6/1998 | ............ 165/104.33 |
| JP | 3070968 | | 6/2000 | |
| JP | 2001-223308 | * | 8/2001 | ............ 165/104.33 |
| TW | 471657 | * | 1/1991 | ............ 165/104.33 |
| TW | 520146 | * | 2/2003 | ............ 165/104.33 |
| TW | 520147 | * | 2/2003 | ............ 165/104.33 |
| TW | 521844 | * | 2/2003 | ............ 165/104.33 |

* cited by examiner

Primary Examiner—Tho Duong
(74) Attorney, Agent, or Firm—Oblon, Spivak, McClelland, Maier & Neustadt, P.C.

(57) ABSTRACT

A tower type heat sink wherein a heat pipe for transporting a heat whereby a latent heat of a working fluid encapsulated therein is erected generally vertical on a top face of a flat plate shaped base portion, and a plurality of heat radiating fins are mounted on said heat pipe, and comprises an intermediate portion formed with bending a portion of said heat pipe where the heat radiating fins are not mounted thereon, and a through hole formed on said base portion for letting through said heat pipe to protrude one of its end portion of which said fins are mounted thereon from the top face of said base portion, and to expose the said heating portion on the bottom face of said base portion.

6 Claims, 9 Drawing Sheets

TOWER TYPE HEAT SINK

BACKGROUND OF THE INVENTION

1. Field of the Invention

The present invention relates to a Tower Type Heat Sink having a structure in which a heat radiating fins are mounted on a heat transferring portion erected on a base portion.

2. Related Art

In general, heat sinks have a function to enlarge substantial heat radiating area of an exothermic member or a hot section by means of contacting with such exothermic member or hot section. Accordingly, it is sufficient for this kind of heat sinks only to be provided with fins for composing a heat radiating face as many as possible. Also, heat sinks structured with fins arranged on its base member in order to have flexibility for cooling objects are used in a general way. However, there is a disadvantage on the heat sinks having such structure due to difficulty of mounting a number of thin plate shaped heat radiating fins on its base member, namely, the actual heat radiating area of those is limited.

On the other hand, there is an advantage on a tower type heat sink which is structured with erecting a heat transferring member such as braces on its base portion and mounting heat radiating fins on such a heat transferring member, that is, the limitation of mounting numbers of heat radiating fins and the limitation of heat radiating area is reduced, because of its availability of mounting heat radiating fins in consequence of fitting those fins into the heat transferring member and the like. An example of this kind of tower type heat sink is disclosed in U.S. Pat. No. 5,412,535, and this heat sink employs a heat pipe or a vapor chamber as said heat transferring member. Namely, a hollow container is erected on the base member and inside of it is employed as a heat pipe, and meanwhile, a plurality of fins is fitted on the outer face of the container.

In the above mentioned heat pipe in the prior art, heat resistance on the part from the base member to the heat radiating fins may be reduced, because the trapezoidal heat pipe or the vapor chamber mediates heat transfer from the base portion to the fins, and furthermore, the heat transfer is executed by a latent heat of a working fluid. In the tower type heat sink having such structure, the heat pipe with fins mounted thereon has to also have a function as a brace for a plurality of fins to be mounted; therefore, the heat pipe and the base member must be fixed integrally. Consequently, there is a disadvantage in productivity due to the complexity of its fixing structure between the heat pipe and the base member.

Moreover, in the tower type heat sink as described hereinbefore, it is necessary to form so-called fixing part, in which fins are not mounted on a part of said heat pipe in order to fix the heat pipe onto the base member. A portion of this fixing part is exposed in the vicinity of the face of the base member unavoidably, as the heat sink is assembled. This fixing portion is a portion for fixing the heat pipe onto the base member, and also is a portion for transferring a heat to the heat radiating member of the heat sink wherein fins are mounted thereon. Accordingly, the fixing part is not a portion to radiate a heat positively, and it is preferable to have a temperature difference against the heat radiating member in order to transfer a heat efficiently from the heating portion to the heat radiating member.

However, in case of sending air to said tower type heat sink by a fan or the like for compulsory cooling purpose, the air stream towards not only the heat radiating member, but also the fixing part exposed from said base portion preferentially. Because, resistance of fluidity of the fins at the heat radiating member is higher than the resistance of fluidity at the fixing part. In consequence, heat transfer cannot be executed efficiently and cooling performance of the tower type heat sink is deteriorated disadvantageously.

SUMMARY OF THE INVENTION

The present invention has been conceived with a view to solve the above described technical problems. In other words, an object of the present invention is to provide a tower type heat sink which is excellent in heat characteristic and also in productivity.

According to the heat sink of the present invention, a heat pipe for transferring a heat whereby a latent heat of a working fluid encapsulated therein is erected generally vertical on a top face or from a bottom face of a flat plate shaped base portion, and a plurality of heat radiating fins are mounted on said heat pipe. This tower type heat sink comprises: a heating portion formed with bending a portion of said heat pipe where the heat radiating fins are not mounted thereon, and a through hole formed on said base portion for letting through said heat pipe to protrude one of its end portion of which said fins are mounted thereon from the top face of said base portion, and to expose the said heating portion on the bottom face of the base portion.

Accordingly, in the tower type heat sink according to the present invention, if the exothermic member is mounted on the face of the base portion where the heating portion of the heat pipe is exposed, the heating portion contacts with the heat pipe directly and heat exchange is generated between them. Moreover, said heating portion to be contacted with the exothermic member is formed with bending an end portion of the heat pipe, and the heat pipe is fixed with the base portion by such heating portion, therefore, fixing part for fixing the heat pipe with the base portion may be formed widely. In consequence, the heat pipe and the base portion can be fixed with each other easily.

Furthermore, in the tower type heat sink according to the present invention, said heating portion is buried in said through hole with having the outer face of said heating portion being flush with the bottom face of the base portion.

Therefore, in such construction, said heating portion is contacted with the exothermic member as a result of that the exothermic member is mounted on the face of the base portion where said heating portion is exposed. Also, heat transferring area between the base portion and the heat pipe may be larger since said heating portion is buried in said through hole. Consequently, the heat of the base portion may be transferred to the heat pipe efficiently.

Furthermore, in the heat pipe according to the present invention, the face where the heating portion is exposed is an installation face, and the exothermic member is mounted on this installation face. Hence the distance between the heating portion and the exothermic member may be shortened, the heat resistance when the heat is transmitted from exothermic member to the heat pipe may be lowered therefore.

Additionally, the heat sink according to the present invention can further comprise a curved portion on the heat pipe wherein heat radiating fins are not mounted, in between the heating portion and the end portion with the heat radiating fins mounted thereon.

A complex installation work of fins may be omitted under such construction; therefore, productivity of the tower type heat sink is improved accordingly.

And according to the present invention, a shield wall for surrounding periphery of the part of said curved portion extending towards top face of the base portion may be erected on one of the face of said base portion.

Because the curved portion of the heat pipe is defiladed by the shield wall from blown air, an air stream is therefore prevented from detouring to avoid fins. Namely, heat dissipation capacity is improved since the air stream passes though fins without fail.

Said heat pipe may be an L-shaped heat pipe in which one of its end portions is bent generally at right angles.

Also, said heat pipe may be a U-shaped heat pipe in which both of its end portions are bent generally at a right angles to an intermediate portion.

Accordingly, in consequence of employing a heat pipe in such shapes, the heating portion of the peat pipe may be formed in large, and also, the heat pipe may be fixed on the base portion easily.

On the other hand, the present invention may be constructed with forming a groove portion for fitting a portion of the heat pipe on one of the face of the base portion, fixing the bent portion of the heat pipe with fitting into a groove or recess, and mounting the fins on the portion extending from the bent portion.

The bent portion of the heat pipe is a heating portion, and a fastening member may be installed for fixing the heating portion to the base portion.

Said heating portion of the heat pipe is tightly fixed to the base portion with being pressed, and outer face of said heating portion becomes a heat transferring face entirely. As a result of this, heat resistance is therefore lowered. Also, the heating portion may be fixed tentatively by means of the fastening member and the base portion.

The tower type heat sink according to the present invention further comprises; a plate for placing the base portion, a fixing member for fixing the base portion with pressing its peripheral portion, and a heat insulating member intervened inbetween the base portion and the fixing member.

This kind of construction may simplify the structure of the exothermic member or fixing structure of a predetermined plate and the base portion, because the base portion itself does not have a fixing function. Also, heat transfer to the plate under non-contacting states with said exothermic member is prevented because of intervention of a heat insulating layer between the fixing member and the base portion.

The above and further objects and novel features of the invention will more fully appear from the following detailed description when the same is read with reference to the accompany drawings. It is to be expressly understood, however, that the drawings are for purpose of illustration only and are not intended as a definition of the limits of the invention.

DESCRIPTION OF THE PREFERRED EMBODIMENTS

Figure 1:
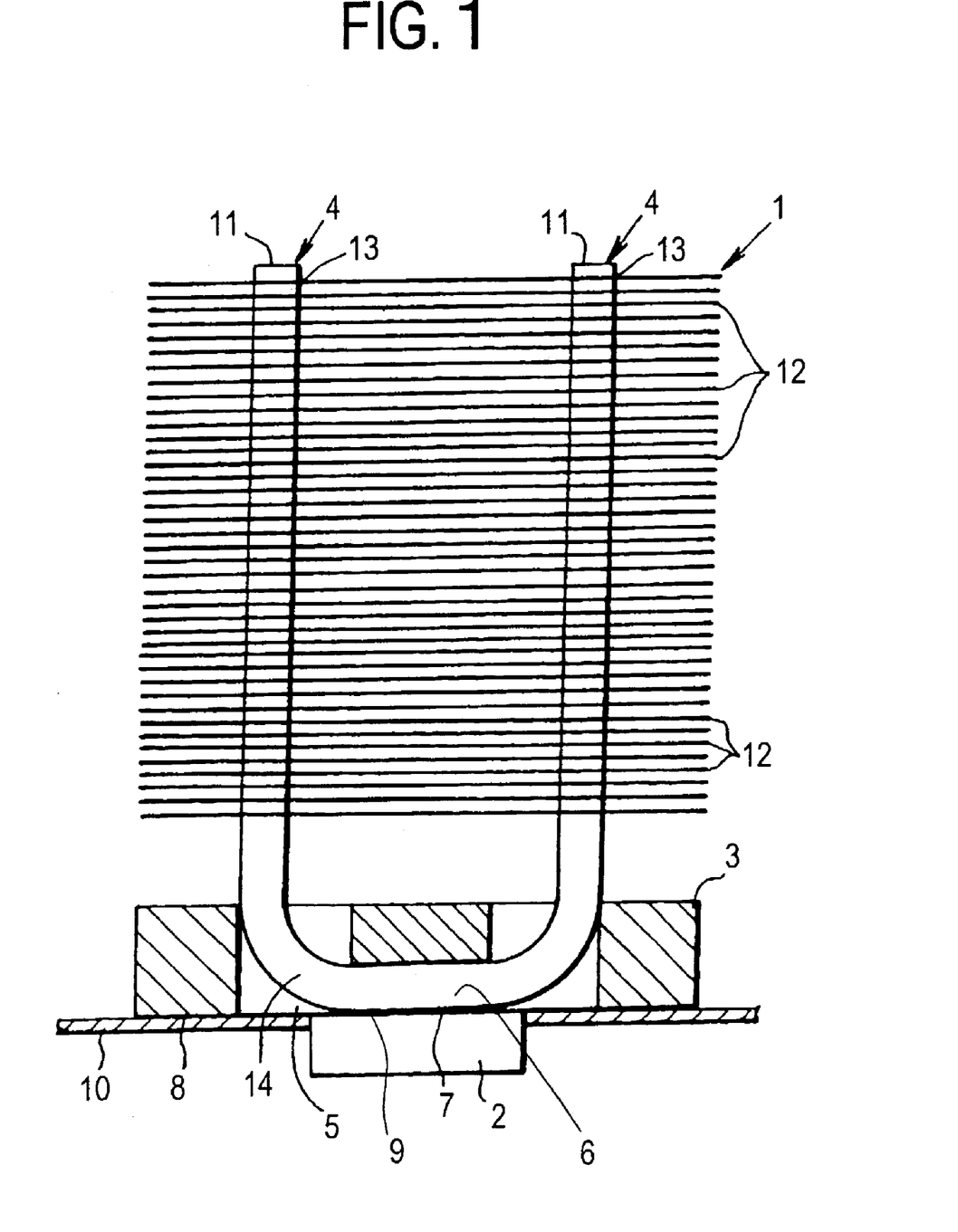
FIG. 1 is an elevation view showing a tower type heat sink according to one embodiment of the invention.
Figure 2:
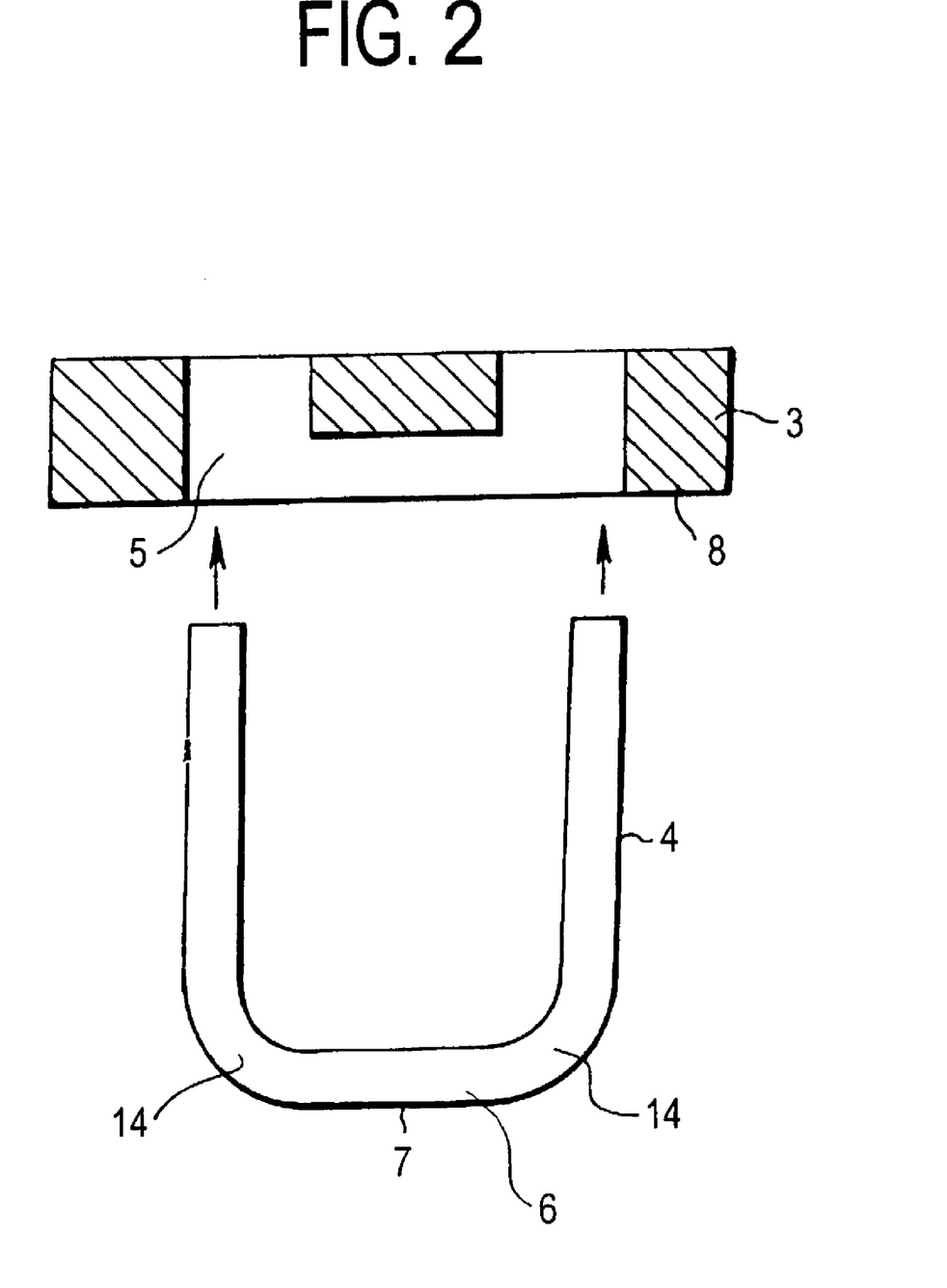
FIG. 2 is an elevation view for showing a heat pipe and a base portion of a tower type heat sink of FIG. 1.

Specific embodiments of the invention will be described with reference to the accompanying drawings. A tower type heat sink 1 as shown in FIG. 1 is so constructed as to cool an exothermic member 2 such as electric parts or the like. In this embodiment, a base portion 3 for letting the exothermic member 2 being contacted in a heat exchangeable manner is formed in a flat shape, with a metal having good heat conductivity such as copper or its alloy. In the base portion 3, there is formed a through hole 5 for a heat pipe 4 to be mounted therein. An intermediate portion 6 of the heat pipe 4 is fitted into the through hole 5, and the intermediate portion 6 is buried inside of the through hole 5 accordingly. Also, a bottom face 7 of the intermediate portion 6 and a bottom face of the base portion 3 are so arranged as to be flush with each other. Said bottom face 8 exposing the bottom face 7 of the heat pipe 4 is regarded as an installation face 9. And a plate 10 is fixed on the rim of the base portion 3.

Both of end portions of the heat pipe 4 are bent generally at right angles in the direction to the intermediate portion so as to be formed in a U-shape. And this U-shaped intermediate portion 6 is fixed with the base portion 3.

On both of leading end portions 11, such as right and left end portion of the heat pipe 4, there are mounted a plurality of fins 12 for heat radiating purpose, and those are regarded as a heat radiating portion. Fins 12 are flat portions made from aluminum or its alloy and the like, and installation holes 13 are formed thereon. Each of fins 12 is fitted with the heat pipe 4 perpendicular to said end portion of the heat pipe 4, and fixed with the heat pipe 4 by appropriate means such as soldering or caulking. And those fins 12 are arranged in parallel each other with keeping predetermined distance. Accordingly, a clearance between fins 12 works as an air passage when compulsory cooling is executed by means of not shown fan or the like.

Fins 12 are not mounted on periphery of a curved portion 14 which connects the intermediate portion 6 and the leading end portion 11 of the heat pipe 4.

Next, action of the aforementioned heat sink will be described hereafter. First of all, a heat generated on the exothermic member 2 is transmitted to the base portion 3 from the installation face 9. In the base portion 3, the bottom face 7 of the intermediate portion 6 of the heat pipe 4 and the bottom face 8 of the base portion 3 are so arranged to be flush with each other; therefore, the intermediate portion 6 as a heating portion and the exothermic member 2 are contacted with each other almost directly. Hence, the heat generated on the exothermic member 2 is transmitted to the heat pipe 4 directly and heat resistance is reduced consequently. Also, the intermediate portion 6 of the heat pipe 4 is buried in the through hole 5 formed on the base portion 3, and a heat conducting area becomes larger accordingly. Therefore, the heat on the base portion 3 is transmitted to the heat pipe 4 efficiently and transferred to the fins 12.

Additionally, a curved portion 14 which is not provided fins 12 is arranged on the heat pipe 4 so that the assembling work can be executed with keeping the curved portion 14 sustained. Accordingly, the installation work to mount fins 12 on the heat pipe 4 becomes easier and the productivity of tower type heat sink is improved consequently.

Moreover, the fixing part of the heat pipe 4 and base portion 3 are formed widely because the heat pipe 4 is formed into U-shape. Accordingly, the heat pipe 4 and the base portion 3 may be fixed easily.

Figure 3:
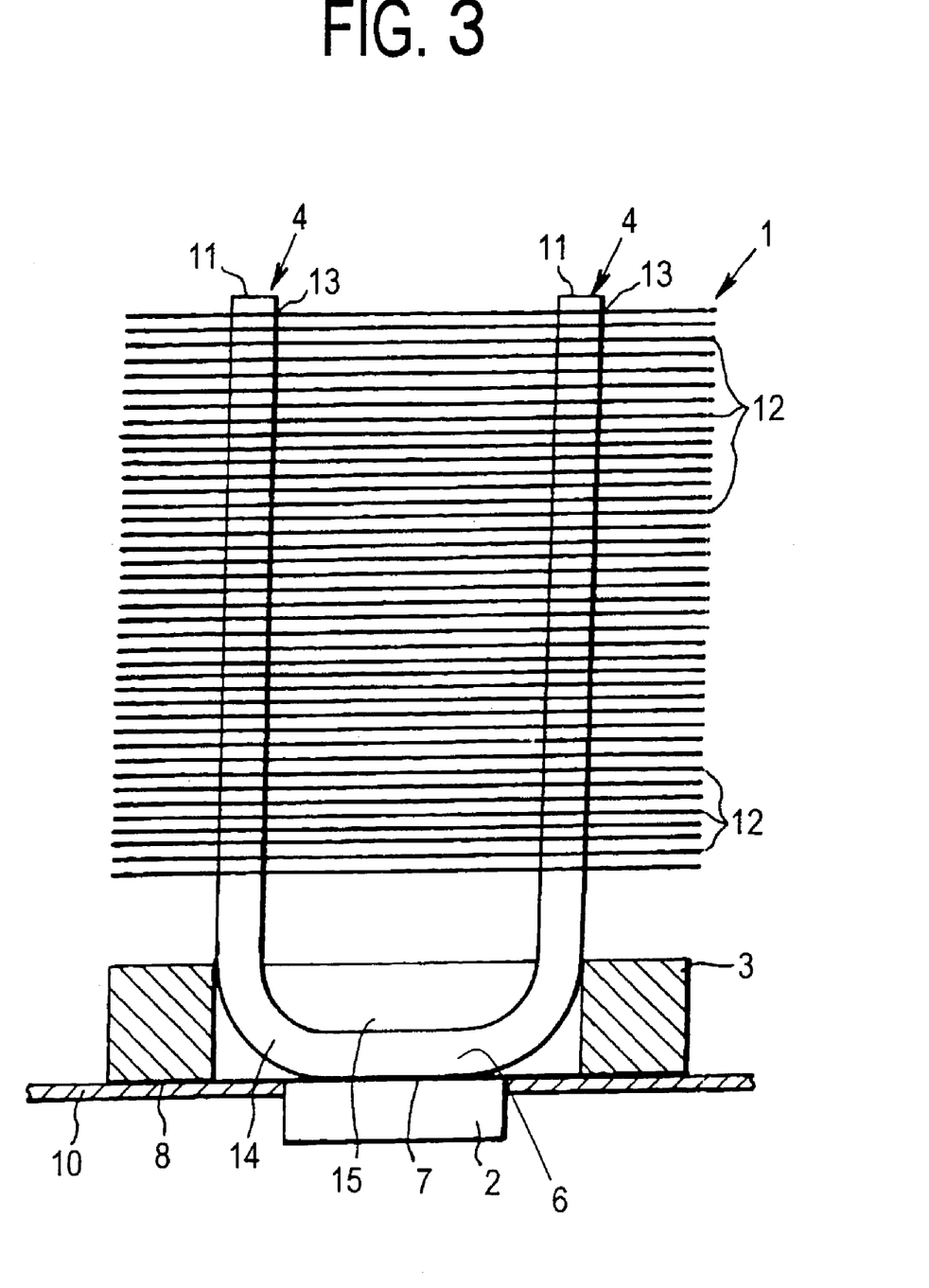
FIG. 3 is an elevation view showing a tower type heat sink according to another embodiment of the invention.
Figure 4:
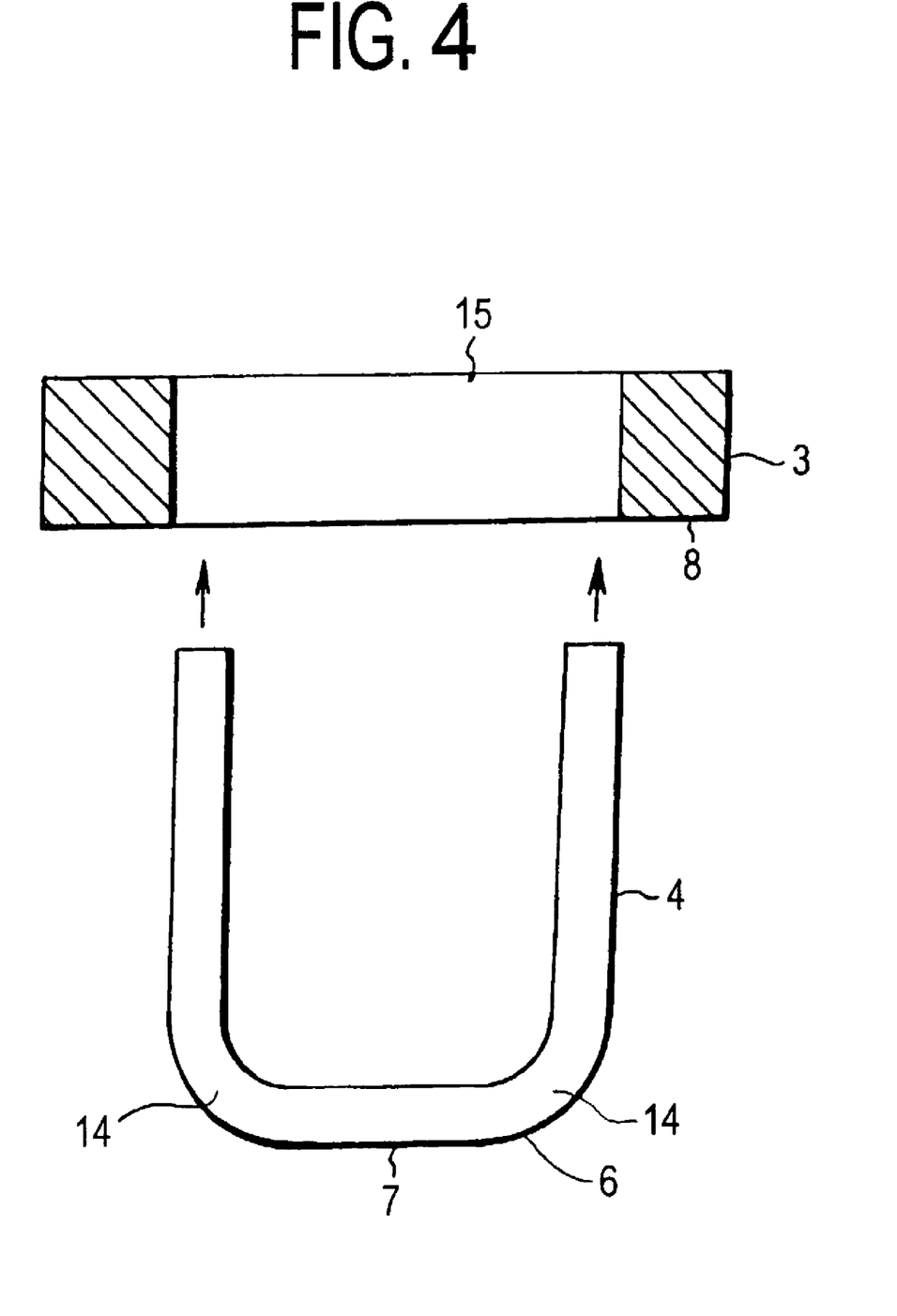
FIG. 4 is an elevation view showing a heat pipe and a base portion of a tower type heat sink of FIG. 3.

Besides, the through hole 5 is formed on the base portion 3 according to the tower type heat sink 1 thus far described, however, the through hole of the tower type heat sink according to the present invention is not limited to the construction of the through hole described above. For instance, as shown in FIG. 3 and FIG. 4, said through hole may be a long hole 15 penetrating the base portion 3 in-depth.

If in the case that the through hole formed on the base portion 3 is the long hole, the heat generated on the exothermic member 2 is transmitted to the base portion 3 from the installation face 9. The intermediate portion 6 as a heating portion and the exothermic member 2 are contacted each other almost directly, because the long hole 15 is formed on the base portion 3, and the bottom face 7 of the intermediate portion 6 and the bottom face of the base portion 3 are so arranged to be flush with each other. Therefore, a heat generated on the exothermic member 2 is transmitted to the heat pipe 4 directly, and the heat resistance is reduced accordingly. Also, the intermediate portion 6 of the heat pipe 4 may be inserted into the long hole 15 from the top face of the base portion 3 because the long hole 15 is a long hole penetrating the base portion 3 in-depth.

Accordingly, if in the case that the through hole of the base portion 3 of the tower type heat sink 1 is the long hole 15, the intermediate portion 6 of the heat pipe 4 may be inserted and fixed in the long hole 15 from the top face of the base portion 3 on the occasion of assembling work of the tower type heat sink 1.

Figure 5:
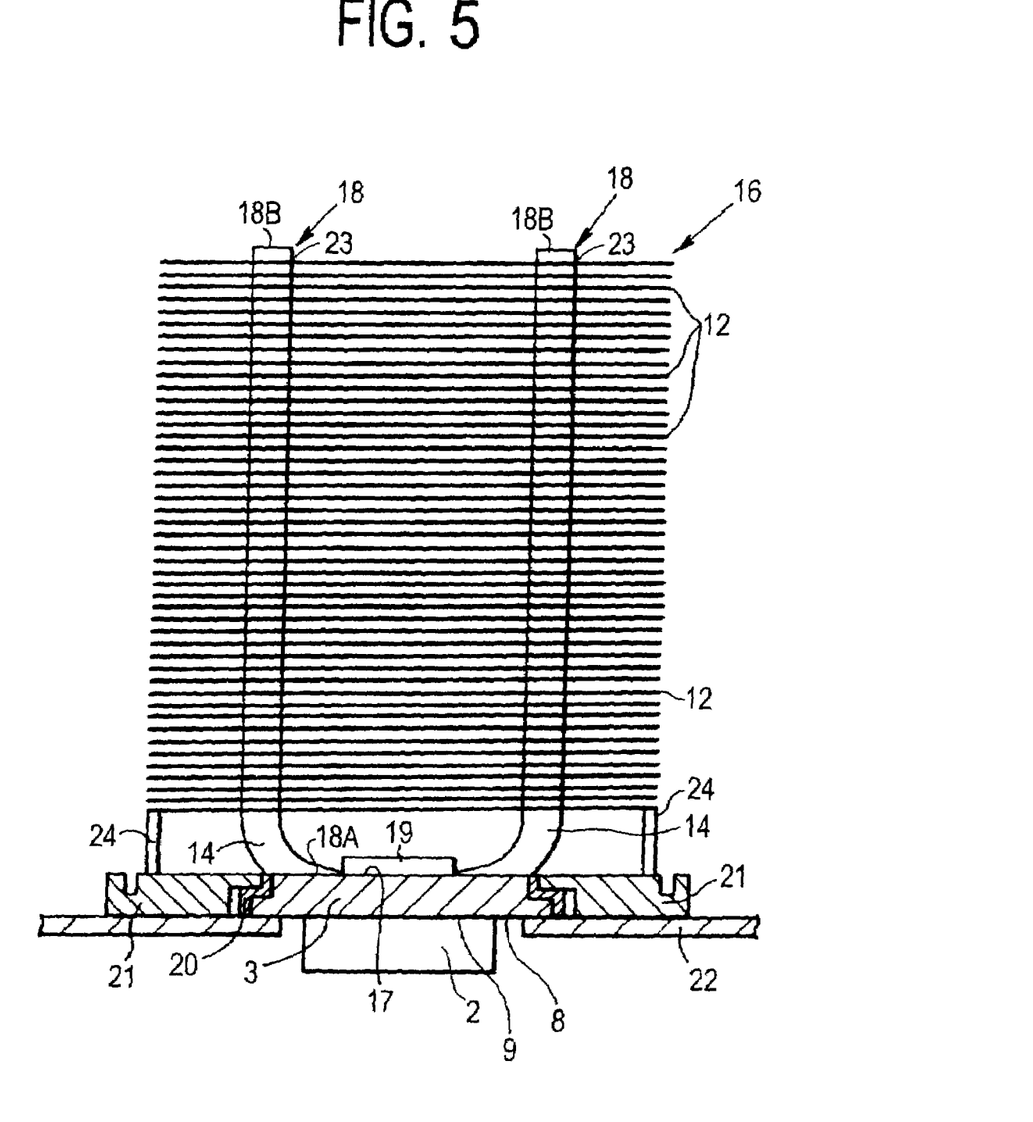
FIG. 5 is an elevation view showing a tower type heat sink according to still another embodiment of the invention.
Figure 6:
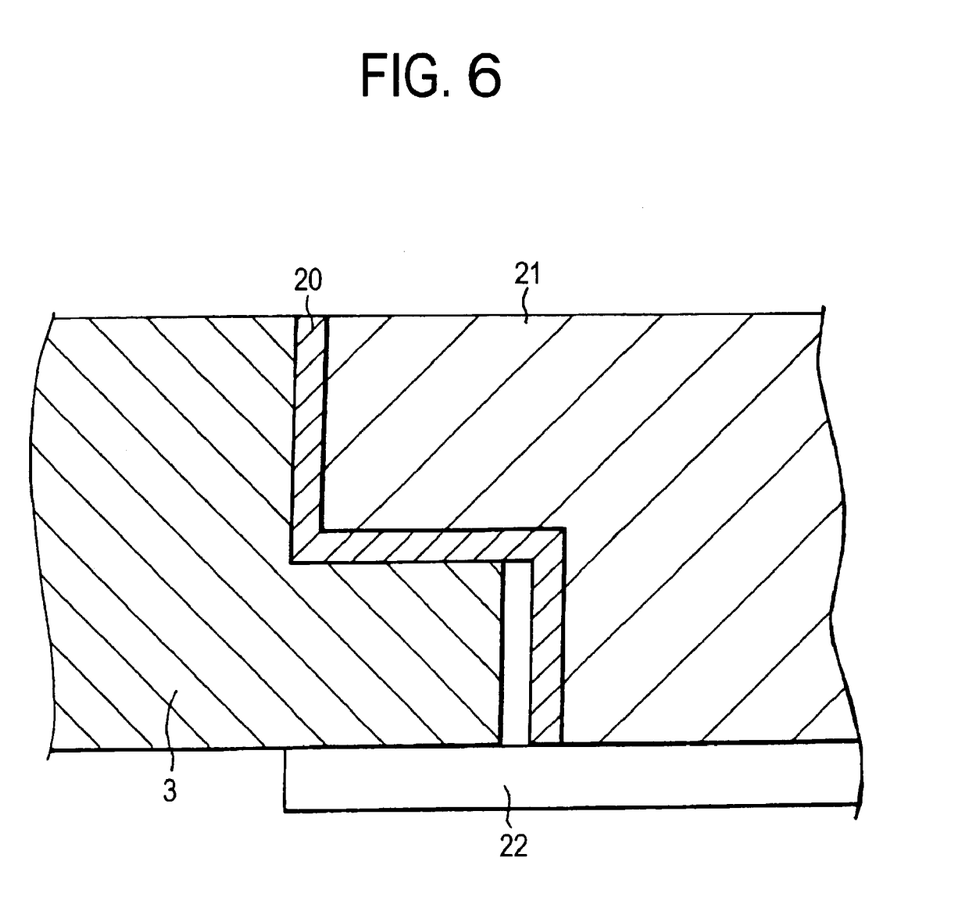
FIG. 6 is a closeup showing a heat insulating layer of a tower type heat sink of FIG. 5.
Figure 7:
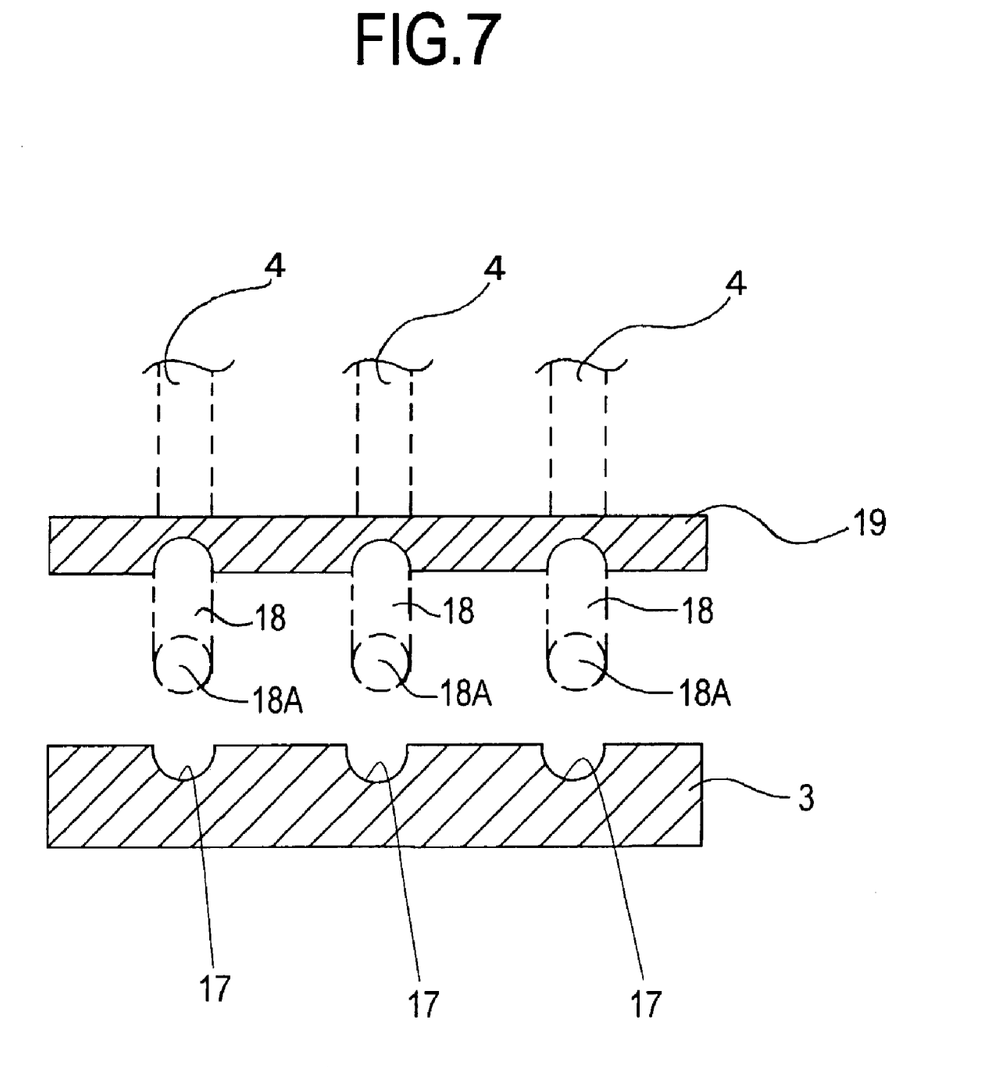
FIG. 7 is an elevation view showing a fixing structure of a heat pipe and a base portion of a tower type heat sink of FIG. 5 simply.
Figure 8:
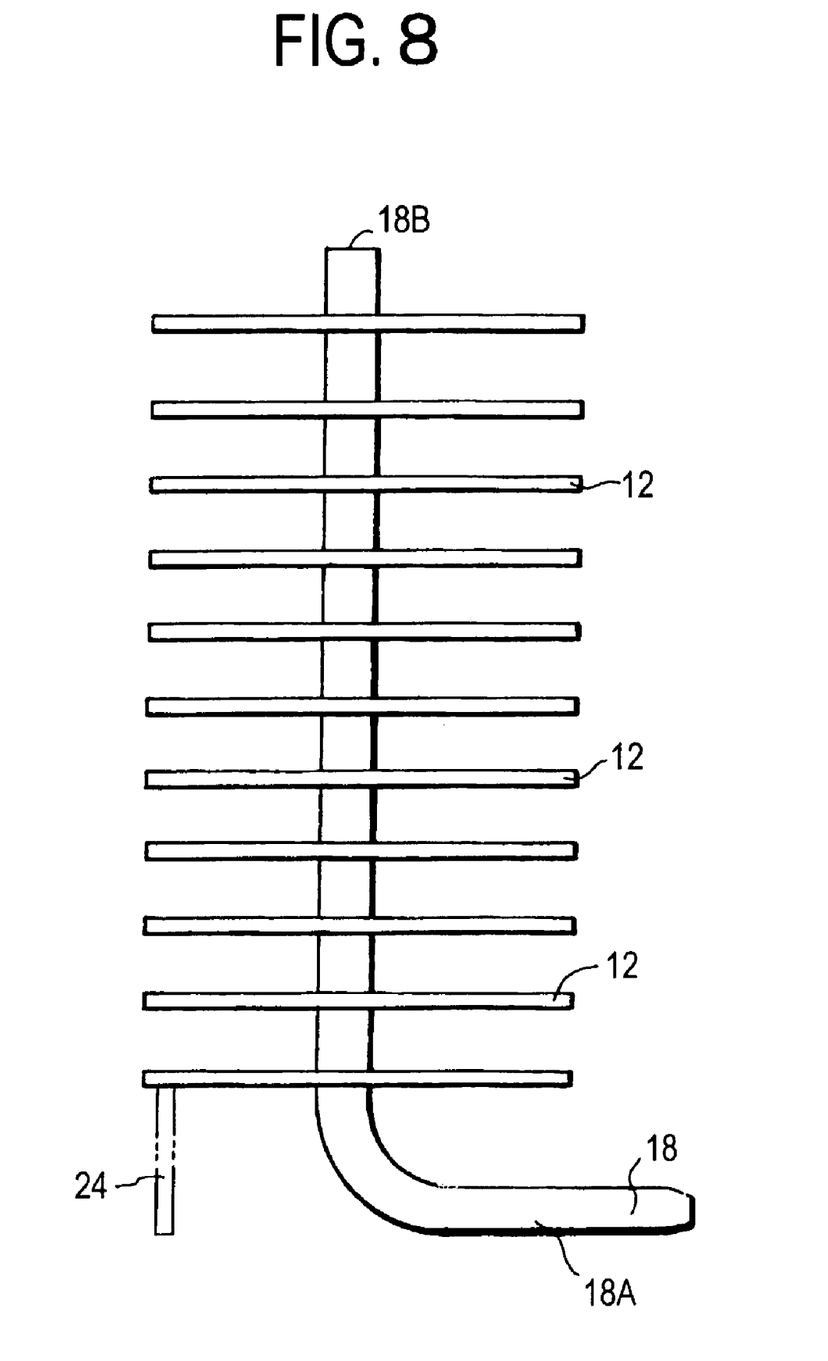
FIG. 8 is an elevation view showing a shield wall of a tower type heat sink of FIG. 5.

Next, another embodiment of the invention will be described hereinafter. However, explanation for the construction equivalent to, or identical to the embodiment mentioned above will be omitted with providing same referential numerals. A tower type heat sink 16 as shown in FIG. 5 is an embodiment of a construction for cooling exothermic member 2 and FIG. 5 is an elevation view showing its overall construction. In the embodiment as depicted in FIG. 5, the bottom face of the base portion 3 is an installation face 9 for contacting, or joining the exothermic member 2 in a heat exchangeable manner.

An installation recess 17 is formed on the top face of the base portion 3, and one of the end portions of the heat pipe 18, namely, a base end portion 18A is fitted in this installation groove 17. The heat pipe 18 as shown in FIG. 5 is a hermetic pipe which works as a container and so bent as to be entirely in L-shape. And its base end portion 18A in short length is fixed on the base portion 3 as a heating portion. An upper cover 19 (namely, a fastening member) covers the part of the base end portion 18A of the heat pipe 18 protruding from said installation groove 17 and fixed tightly on the top face of the base portion 3. That is to say, the base end portion 18A is fixed by the base portion 3 and the upper cover 19.

In the periphery of the base portion 3, there is mounted a fixing member 21 with a plastic sheet 20 formed from the material having low heat conductivity such as plastic is being interposed therebetween. Accordingly, the plastic sheet 20 works as a so-called heat insulting layer between the base portion 3 and the fixing member 21.

The fixing member 21 is a member for fixing the plate 22 and made from a material such as aluminum or its alloy. The construction of base portion 3 outperforms the fixing member 21 in the heat conductivity so that the heat is increasingly apt to concentrate at the base portion 3.

Moreover, a plurality of fins 12 is mounted on the leading end portion 18B i.e., the other end portion of said L-shape of the heat pipe 18, and works as a heat radiating portion. These fins 12 are thin plate portions made from metal such as aluminum or its alloy.

Figure 9:
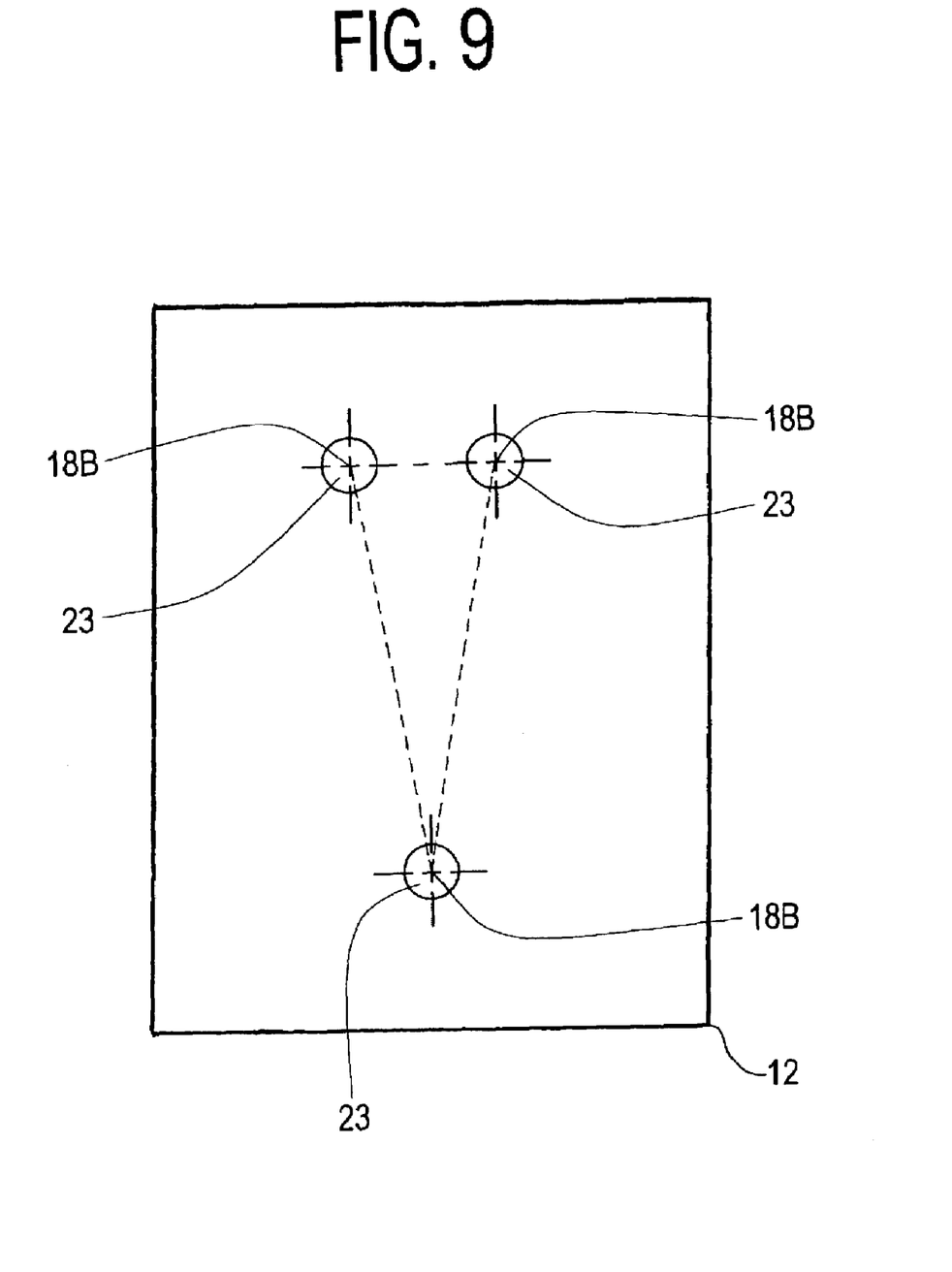
FIG. 9 is a plane view showing a fin of a tower type heat sink of FIG. 5.

There are three of said heat pipes 18 provided and leading end portions 18B of those heat pipes 18 are so arranged to form triangle and located in each corner, as depicted in FIG. 9. On the other hand, there are three of installation holes 23 formed in each fins 12 for fitting the leading end portions 18B of the heat pipes 18 therein. The installation state of each fin 12 against the heat pipes 18 is same as the state of the heat sink described above and shown in FIG. 1.

The fins 12 are not mounted in the periphery of said L-shaped curved portion 4 of the heat pipe 18, and a shield wall 24 is erected on the base portion 3 for surrounding the curved portion 4 of the heat pipe 18. In other words, the shield wall 24 is so erected on the top face of the base portion 3 for defilading rest of the portion except the air passage in the air streaming direction of the fins 12, in case of sending air by means of not shown fan or the like.

The action of above mentioned tower type heat sink 16 will be described hereafter. First of all, mount the exothermic member 2 onto the tower type heat sink 16. At this step, the exothermic member 2 contacts with the base portion 3. Then, a heat is generated by the operation of the exothermic member 2, and the heat is transmitted to the base portion 3. On the base portion 3, a plurality of base end portions 18A of pipe shaped heat pipe 18 is embedded and fixed in the installation recess 17 of the base portion 3, therefore, the heat transmitting area between the heat pipe 18 and the base portion 3 becomes larger. Accordingly, the heat on the base portion 3 is transmitted to the heat pipe 18 efficiently and transported to the fins 12.

Moreover, since the base end portion 18A of the heat pipe 18 is fixed by the base portion 3 and the upper cover 19, entire outer face of the base end portion 18A functions as a heat conducting face to the base portion 3 and the heat resistance becomes therefore lower. Consequently, the heat generated on the exothermic member 2 is transported to the fins 12 efficiently.

Furthermore, the plastic sheet 20 interposed in between the base portion 3 and the fixing member 21 functions as a heat insulating layer, so that the heat conducting from the base portion 3 to the plate 22 via the fixing member 21 is prevented.

Because of the leading end portions 18B of said heat pipe 18 are arranged in the triangle formation, the construction of the heat pipe 18, fins 12, and the base portion 3 becomes so-called truss structure and rigidity of the tower type heat sink is therefore improved.

Moreover, the base portion 3 itself does not have a fixing function, so that the structure of the exothermic member 2 and the fixing structure between the predetermined plate 22 and the base portion 3 becomes simple.

Furthermore, the heat of the base portion 3 is transmitted to the base end portion 18A, and the heat transmitted to the base end portion 18A is transferred to a heat radiating portion by the heat pipe 18. Then, the heat transferred to the heat radiating portion is diffused outward from the wide face of the fins 12.

On this occasion, the base end portion 18A of the heat pipe 18, or the exposed curved portion 14, other than the heat radiating portion is defiladed from said air stream by the shield wall 24 erected on the base portion 3. Therefore, said air stream is prevented from making a detour to avoid the fins 12. In other words, even if the fins 12 are arranged closely to the heat pipe 18, it is easy for the blown air to pass through the fins 12 and preferable heat radiating effect may be obtained.

Besides, since the upper cover 19 is fixed tightly on the top face of the base portion 3 in the construction mentioned above, entire outer face of the base end portion 18A of said heat pipe 18 functions as a heat conducting face to the base portion 3, and heat resistance becomes lower accordingly. As a result, the heat characteristic may be improved.

Also, the plastic sheet 20 is so interposed as a heat insulating layer between the base portion 3 and the fixing member 21, so that most of the heat conducted to the base portion 3 is conducted to the intermediate portion 6 without being diffused on the base portion 3. Accordingly, temperature drop caused by said diffusion may be decreased and the periphery of the intermediate portion 6 may also be kept in high temperature. If the periphery of the intermediate portion 6 is kept in high temperature, ebullition and evaporation of the working fluid in the heat pipe 18 may be executed efficiently. Consequently, heat transferring efficiency of the heat pipe 18 may be improved, that is, heat radiating capacity of the heat sink 16 is improved. Hence, the necessity for providing a cover or the like on the fixing member 21 for protecting the plate 22 from the heat may be omitted. Accordingly, productivity of the tower type heat sink 16 is improved.

Moreover, in the heat sink 16 as depicted in FIG. 5, the base portion 3 is formed with a material having better heat conductivity as compared with the fixing member 21. Accordingly, most of the heat conducted from the exothermic member 2 to the base portion 3 may be transmitted to the base end portion 18A of the heat pipe 18, so that the heat generated on the exothermic member 2 may be transferred to the heat radiating portion efficiently. As a result, heat radiating capacity may be improved.

Besides, three of heat pipes 18 bent in L-shape are employed in the tower type heat sink 16 of the embodiment described above, however, the tower type heat sink according to the invention is not limited in the shape and number of the above mentioned heat pipe. For example, a heat pipe, which is bent in U-shape may also be employed and constructed with fixing its intermediate portion on the base portion.

Furthermore, in the tower type heat sink 16 as described in the above embodiment, the curved portion 14 of the heat pipe 18 is defiladed from the air stream by the shield wall 24, however, the construction of this shield wall is not limited in the construction of the above mentioned shield wall 24 on the other hand. For example, the periphery of each heat pipe 18 may be covered with a film portion in order to defilade from the said air stream. The point is, it is sufficient for the portion where the fins of the heat pipe are not arranged to be defiladed from the air stream, and the material and the shape of the shield wall is not limited in particular.

Meanwhile, the present invention is so constructed as to fix the base portion with the heat pipes erected thereon to the plate with the fixing portion. Therefore, according to the present invention, the base portion may be downsized within the size the exothermic member may be mounted. Accordingly, it is possible to be constructed with the base portion made from a metal having preferable heat conductivity, and the fixing member made from inexpensive material. For instance, the base portion may be made from copper, and the fixing member may be made from aluminum. In consequence, the entire cost of the heat pipe may be curbed cheaper. In such case, it is unnecessary for said heat insulating layer to be interposed, and also, it is possible for the exothermic member to be contacted with the plate, e.g., to be installed on the plate.

The advantages which may be obtained from the present invention will be described conclusively hereinafter. According to the invention, both of the heat resistances, such as between the base portion and the heat pipe, and between the exothermic member and the heat pipe may be reduced and therefore the heat pipe having an excellent heat radiating characteristic may be obtained; because, it is constructed with bending the leading end portion or the intermediate portion of the heat pipe generally at right angles, and fixing to the flat plat shaped base portion with exposing this bent part on the bottom face of the base portion in order to contact or to join the exothermic member with the exposing part in a heat exchangeable manner. Moreover, the heat pipe and the base portion may be joined easily and certainly because the joining dimension is wide.

Besides, according to the invention, fins are not mounted on the curved portion of the heat pipe so that the complex installation work may be omitted. As a result, productivity of the heat pipe may be improved. If it is constructed so as to surround the curved portion with no fins mounted thereon by the shield wall, detouring of cooling air to avoid the fins may be restricted. Namely, the heat radiating efficiency may be improved with leading the cooling air in a positive manner. Furthermore, if it is structured with bending the heat pipe in a U-shape, fitting its intermediate portion into the installation groove formed on the base portion, and fixing the intermediate portion against the base portion with the fastening member, the productivity of the heat sink will be improved. If the base portion having such structure is constructed so as to be fixed to the plate by the fixing portion with interposing the heat insulating member between the fixing member, the heat may be radiated more positively by means of the heat pipe and fins mounted thereon, and the heat radiating characteristic of the entire heat sink may be improved as a result. Furthermore, the structure of the base portion, or exothermic member to be contacted thereon may be simplified.

What is claimed is:

1. A tower type heat sink wherein a heat pipe for transferring a heat by a latent heat of a working fluid encapsulated therein is erected generally vertical on a top face of the flat plate shaped base portion, and a plurality of heat radiating fins are mounted on said heat pipe, comprising:

a heating portion formed by bending a part of said heat pipe where said heat radiating fins are not mounted thereon;

an installation groove formed on said base portion, an end portion of the heat pipe of which said fins are mounted thereon protrudes from the installation groove from the top face of said base portion, said heating portion being fixed within the installation groove generally in parallel with said bottom face of the base portion;

a curved portion formed on the heat pipe between the part where fins are mounted and said heating portion with no fins mounted thereon, and extending towards the top face of the base portion from said installation groove;

a fixing member for fixing said base portion by pressing a peripheral part of said base portion; and a heat insulating member intervening in between said base portion and said fixing member.

2. A tower type heat sink according to claim 1, further comprising:

an installation face formed on the bottom face of said base portion, and an exothermic member is to be contacted thereon.

3. A tower type heat sink according to claim 1, further comprising:

a fastening member mounted on the top face of the base portion, for fixing said heating portion to said base portion by pressing.

4. A tower type heat sink according to claim 1, further comprising a shield wall erected for surrounding the periphery of said curved portion, wherein said shield wall is erected on said fixing member.

5. A tower type heat sink according to claim 1, wherein said heat pipe comprises an L-shaped heat pipe in which one of its end portion is bent generally at right angles, and wherein said heating portion is formed on said end portion which is bent generally at right angles.

6. A tower type heat sink according to claim 1, further comprising a shield wall erected for surrounding the periphery of said curved portion.

* * * * *